(12) United States Patent
Ugur et al.

(10) Patent No.: US 11,474,145 B2
(45) Date of Patent: Oct. 18, 2022

(54) METHODS OF DETERMINING OPERATING CONDITIONS OF SILICON CARBIDE POWER MOSFET DEVICES ASSOCIATED WITH AGING, RELATED CIRCUITS AND COMPUTER PROGRAM PRODUCTS

(71) Applicant: Board of Regents, The University of Texas System, Austin, TX (US)

(72) Inventors: Enes Ugur, Richardson, TX (US); Bilal Akin, Richardson, TX (US); Fei Yang, Plano, TX (US); Shi Pu, Plano, TX (US); Chi Xu, Plano, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 233 days.

(21) Appl. No.: 16/897,719

(22) Filed: Jun. 10, 2020

(65) Prior Publication Data
US 2020/0408829 A1     Dec. 31, 2020

Related U.S. Application Data

(60) Provisional application No. 62/863,102, filed on Jun. 18, 2019.

(51) Int. Cl.
*G01R 31/26* (2020.01)

(52) U.S. Cl.
CPC ..... *G01R 31/2642* (2013.01); *G01R 31/2601* (2013.01); *G01R 31/2621* (2013.01); *G01R 31/2644* (2013.01)

(58) Field of Classification Search
CPC ............ G01R 31/2601; G01R 31/2621; G01R 31/2642; G01R 31/2644; G01R 31/26; G01R 31/2607; G01R 31/2321–2623; G01R 31/2625; G01R 31/2626; G01R 31/2628; G01R 31/2637; G01R 31/2639
USPC ..................................................... 324/762.09
See application file for complete search history.

(56) References Cited

U.S. PATENT DOCUMENTS

2017/0285095 A1* 10/2017 Yanagi ............... G01R 31/2601
2019/0033362 A1*  1/2019 Aeloiza ............... H01L 29/1608

OTHER PUBLICATIONS

Quaida et al. Gate Oxide Degradation of SiC MOSFET in Switching Conditions, IEEE Elec. Dev. Let. vol. 35. N. 12 2014, pp. 1284-1286 (Year: 2014).*
Gothner et al. Challenges of SiC MOSFET Power Cycling Methodology, EPE'18 ECCE Europe IEEE, pp. P.1-P.8 (Year: 2018).*
Choi, et al; *Reliability Improvement of Power Converters by Means of Condition Monitoring of IGBT Modules*; IEEE Transactions on Power Electronics, vol. 32, No. 10; Oct. 2017; pp. 7990-7997.

(Continued)

*Primary Examiner* — Jermele M Hollington
*Assistant Examiner* — Courtney G McDonnough
(74) *Attorney, Agent, or Firm* — Stanek Lemon Crouse & Meeks, PA

(57) ABSTRACT

Embodiments according to the invention can provide methods of testing a SiC MOSFET, that can include applying first and second voltage levels across a gate-source junction of a SiC MOSFET and measuring first and second voltage drops across a reverse body diode included in the SiC MOSFET responsive to the first and second voltage levels, respectively, to provide an indication of a degradation of a gate oxide of the SiC MOSFET and an indication of contact resistance of the SiC MOSFET, respectively.

19 Claims, 12 Drawing Sheets

(56) References Cited

OTHER PUBLICATIONS

Singh et al; *Evaluation of $V_{ce}$ at Inflection Point for Monitoring Bond Wire Degradation in Discrete Packaged IGBTs*; IEEE Transactions on Power Electronics, vol. 32, No. 4; Apr. 2017; pp. 2481-2484.
Hanif, et al; *Detection of Gate Oxide and Channel Degradation in SiC Power MOSFETs using Reflectometry*; IEEE Xplore; (2017); pp. 383-387.
Dusmez et al; *In situ Condition Monitoring of High-Voltage Discrete Power MOSFET in Boost Converter Through Software Frequency Response Analysis*; IEEE Transactions on Industrial Electronics, vol. 63, No. 12; Dec. 2016; pp. 7693-7702.
Pu et al; *In situ Degradation Monitoring of SiC MOSFET Based on Switching Transient Measurement*; IEEE Transactions on Industrial Electronics, vol. 67, No. 6; Jun. 2020; p. 5092-5100.
Pu et al; *SiC MOSFET Aging Detection Based on Miller Plateau Voltage Sensing*; IEEE Xplore; (2019) 6 pages.
Erturk et al. *Real-Time Aging Detection of SiC MOSFETs*; IEEE Transactions of Industry Applications, vol. 55, No. 1; Jan./Feb. 2019; p. 600-609.
Ren et al; *Real-Time Aging Monitoring for Power MOSFETs using Threshold Voltage*; IEEE Xplore; (2016); p. 441-446.
Ali et al; *A Simple Plug-In Circuit for IGBT Gate Drivers to Monitor Device Aging*; IEEE Xplore; (2018); p. 45-55.
Aichinger et al.; *Threshold Voltage Peculiarities and Bias Temperature Instabilities of SiC MOSFETs*; Microelectronics Reliability 80; (2018); p. 68-78.
Santini et al.; *Accelerated Degradation Data of SiC MOSFETS for Lifetime and Remaining Useful Life Assessment*; Microelectronics Reliability 54 (2014); pp. 1718-1723.
Nguyen et al; *Gate Oxide Reliability Issues of SiC MOSFETs Under Short-Circuit Operation*; IEEE Transactions on Power Electronics, vol. 30, No. 5; May 2015; p. 2445-2455.
Ouaida et al; *Gate Oxide Degradation of SiC MOSFET in Switching Conditions*; IEEE Electron Device Letters, vol. 35, No. 12, Dec. 2014; pp. 1284-1286.
Pu et al; *Real-Time Degradation Monitoring of SiC-MOSFETs through Readily Available System Microcontroller*; IEEE Xplore; 978-1-5386-3117 (2017); pp. 378-382.
Chen et al.; *A Review of SiC Power Module Packaging: Layout, Material System and Integration*; CPSS Transactions on Power Electronics and Applications, vol. 2, No. 3; Sep. 2017; pp. 170-186.

\* cited by examiner (b)

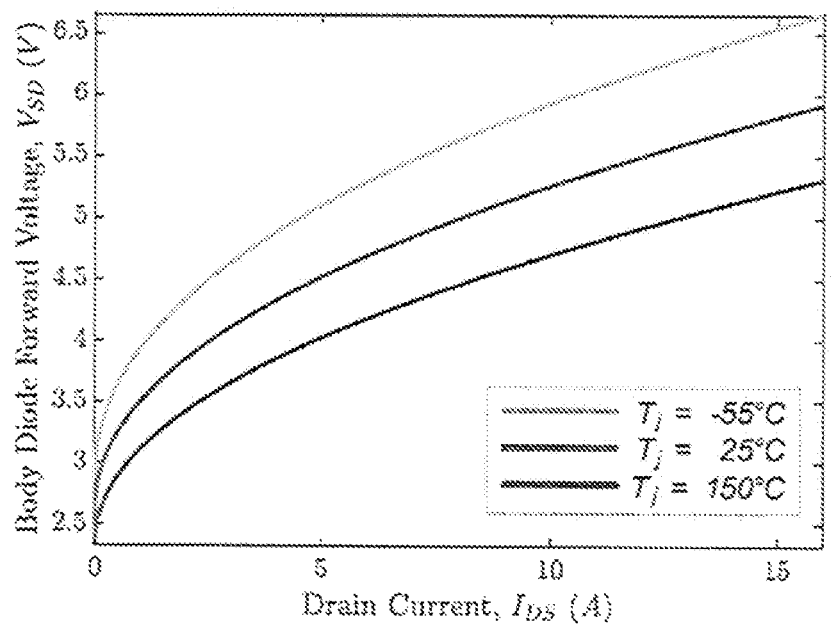
FIG. 16
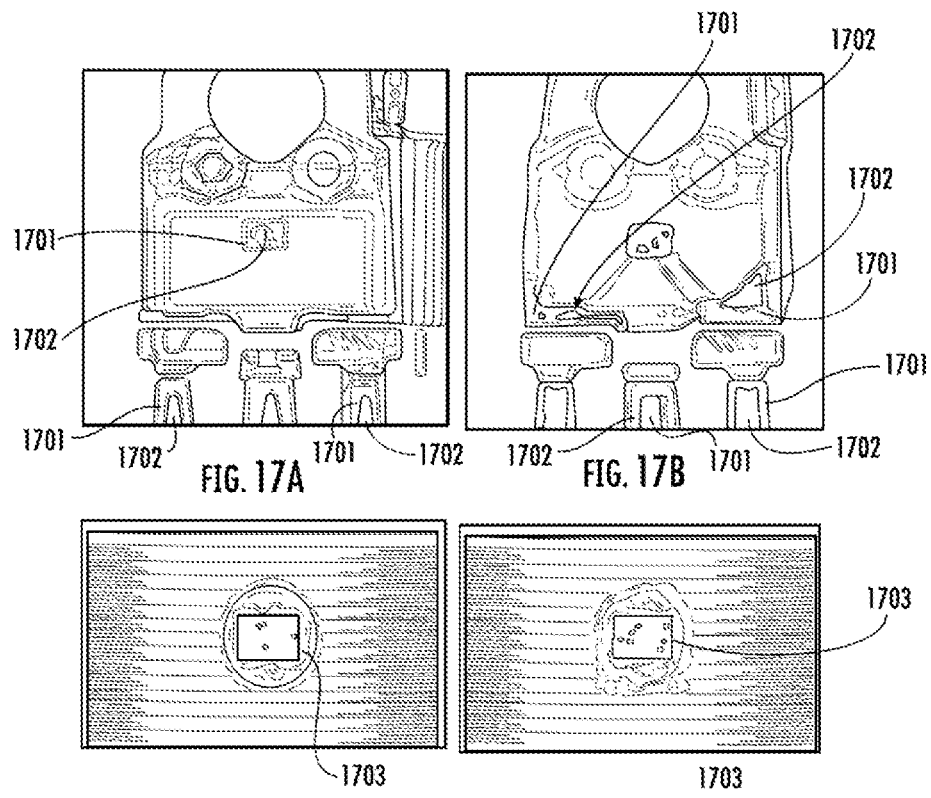
FIG. 17A  FIG. 17B
FIG. 17C  FIG. 17D

METHODS OF DETERMINING OPERATING CONDITIONS OF SILICON CARBIDE POWER MOSFET DEVICES ASSOCIATED WITH AGING, RELATED CIRCUITS AND COMPUTER PROGRAM PRODUCTS

CLAIM FOR PRIORITY

The present Application claims priority to U.S. Provisional Application Ser. No. 62/863,102 entitled Condition Monitoring Method and System for Power MOSFETs, filed in the U.S.P.T.O on Jun. 18, 2019, the entire disclosure of which is hereby incorporated herein by reference.

STATEMENT OF GOVERNMENT SUPPORT

This invention was made with government support under Grant No. 1454311 awarded by the National Science Foundation. The government has certain rights in the invention.

FIELD

The present invention relates to the field of electronics in general, and more particularly, to SiC power MOSFET devices.

BACKGROUND

A number of studies have focused on identifying aging precursors for Si devices. For example, gradual variation in the on-state resistance (Rds_on) of MOSFETs and in saturation voltage of IGBTs are common parameters used as aging indicators. Some studies have investigated the failure precursors in SiC MOSFETs. A major reliability concern for SiC MOSFETs is the gate oxide degradation and the bias-temperature-instability (BTI).

Some SiC MOSFET reliability studies have focused on finding the failure precursors which are indicative of gate oxide degradation. The threshold voltage (Vth) is one of the most commonly studied precursors for monitoring the gate oxide degradation. In particular, the gate leakage current may increase suddenly before gate oxide breakdown, which has been proposed as one way to detect the gate oxide degradation. Gate plateau (or Miller) voltage, gate plateau time, and turn-on time have also been proposed as precursors of gate oxide degradation. Although Rds,on is a well-known precursor for packaging related degradation, the gate oxide degradation has also been found to vary Rds_on due to its dependence on Vth.

Another reliability concern for SiC MOSFETs is related to packaging including the issues of bond wire cracking, bond wire lift-off, and die attach solder degradation. Although some new packaging technologies have been introduced to increase the reliability of power modules, conventional packaging and wire bonding techniques may still be utilized for the majority of commercial SiC power devices. It is known to evaluate the packaging degradation of SiC MOSFETs using an accelerated high temperature power cycling test and to provide an increasing trend in on-state resistance with aging. The body diode voltage drop Vsd and thermal impedance have also been identified as precursors for packaging related degradation.

Although different aging precursors are identified for gate oxide degradation and packaging related degradation, a different precursor is used to indicate the state-of-health of the device for a corresponding degradation mechanism. On the other hand, the dominant degradation mechanism in a real application depends on the packaging technology and the application conditions. Moreover, each degradation mechanism can be the cause or result of the other one.

SUMMARY

Embodiments according to the invention can provide methods of determining operating conditions of silicon carbide power MOSFET devices associated with aging, related circuits and computer program products. Pursuant to these embodiments, a method of operating a SiC MOSFET can be provided by applying a first voltage across a gate-source junction of the SiC MOSFET to enable conduction of current predominantly through a reverse body diode of the SiC MOSFET rather than through a channel region of the SiC MOSFET. A first current can be conducted into a source terminal of the SiC MOSFET through the reverse body diode to a drain terminal of the SiC MOSFET responsive to the first voltage. A first drain-source voltage resulting from conducting the first current through the reverse body diode can be determined. A second voltage can be applied across the gate-source junction to enable conduction of current predominantly through the channel region rather than through the reverse body diode. A second drain-source voltage resulting from conducting current through the channel region responsive to the second voltage can be determined. An indication of contact resistance of the SiC MOSFET as a function of aging of the SiC MOSFET using the first drain-source voltage can be determined and an indication of a degradation of a gate oxide of the SiC MOSFET as the function of aging of the SiC MOSFET can be determined using the second drain-source voltage.

Embodiments according to the invention can provide methods of testing a SiC MOSFET, that can include applying first and second voltage levels across a gate-source junction of a SiC MOSFET and measuring first and second voltage drops across a reverse body diode included in the SiC MOSFET responsive to the first and second voltage levels, respectively, to provide an indication of a degradation of a gate oxide of the SiC MOSFET and an indication of contact resistance of the SiC MOSFET, respectively.

BRIEF DESCRIPTION OF THE FIGURES

FIG. 14 is a graph illustrating reverse body diode voltage drop increase of device 2C-2 as a function of power cycles at different current values using Vgs=−5V in some embodiments according to the invention.

FIG. 15 is a graph illustrating reverse body diode voltage drop increase of device 2C-2 as a function of power cycles at different current values using $V_{gs}$=0V in some embodiments according to the invention.

FIG. 16 is a graph illustrating variation of source-drain voltage VSD vs. drain current for various temperatures using $V_{gs}$=−5V in some embodiments according to the invention.

FIG. 17A-D are C-SAM images of the switches through power cycling including a top side C-SAM image of 2C-2, a top side C-SAM image of 2C-3, a bottom side C-SAM image of 2C-2, and a bottom side C-SAM image of 2C-3, respectively, in some embodiments according to the invention.

DETAILED DESCRIPTION OF EMBODIMENTS ACCORDING TO THE INVENTION

Figure 1:
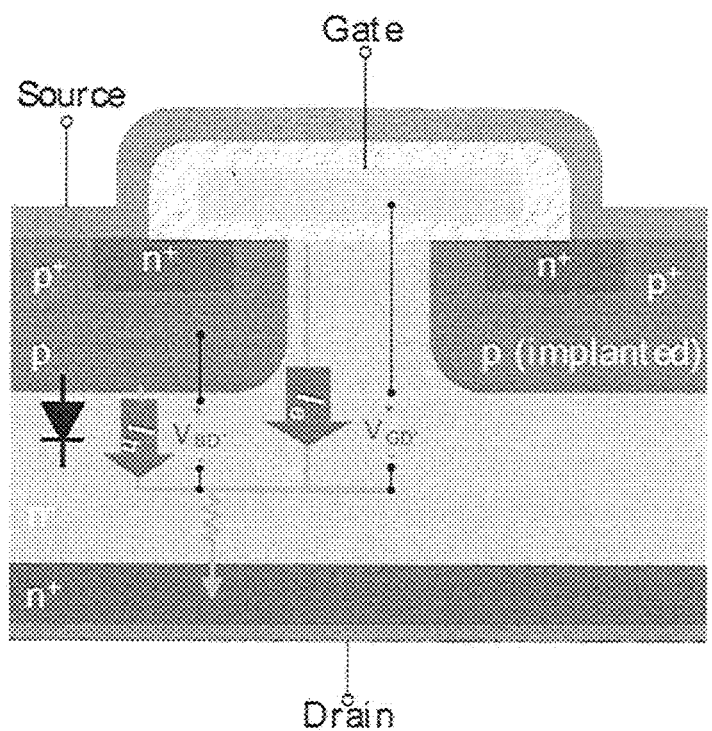
FIG. 1 is a schematic representation of a SiC MOSFET device including particular doped semiconductor regions therein and a reverse body-diode conduction path and a channel region conduction path through which respective applied currents can flow in response to voltages applied across the gate-source junction of the SiC MOSFET in some embodiments according to the invention.

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As appreciated by the present inventors, embodiments according to the invention can provide condition monitoring for SiC MOSFETs using a single precursor parameter: the reverse body diode voltage drop (across the source-drain terminals) at different gate bias levels. By monitoring this single precursor parameter both the degradation of gate oxide and packaging related degradation can be monitored as a function of aging of the SiC MOSFET.

In particular, different voltages can be applied across the gate-source junction of the SiC MOSFET so that current provided to the device flows predominantly through one of two conduction paths: 1) through the reverse body-diode or 2) through the channel region. As appreciated by the present inventors, each voltage that is developed as a result of the current flowing in these two conduction paths can indicate a corresponding one of the conditions as the device ages: 1) an increase in contact resistance and 2) an increase in the gate threshold voltage, respectively.

Accordingly, when the current flows through the reverse body-diode, the voltage measured across the source-drain of the device can indicate the contact resistance associated with the SiC MOSFET. In contrast, when the current flows through the channel region, the voltage measured across the source-drain of the device can indicate the gate threshold voltage of the SiC MOSFET. In operation, therefore, different voltages are applied across the gate-source junction so that the SIC MOSFET operates in the two different conduction modes at different times. The resulting voltages developed across the source-drain of the device can indicate the respective condition being monitored substantially independently of one another. Further, the resulting voltages developed across the source-drain of the device can be recorded over time so that the effect of aging on the device can be monitored.

It will be understood that, in some embodiments according to the invention, the SiC MOSFET may be operated so that all of the current applied to the device flows through one of the conduction paths (the reverse body-diode or the channel region). Accordingly, all of the current may flow through the reverse body-diode path and none flows through the channel region. In other embodiments according to the invention, the current flows predominantly through the selected conduction path. For example, a first gate-source voltage may be applied to the device so that the current applied to the drain flows predominantly through the reverse body-diode path whereas a lesser portion of current may flow through the channel region. Also, a second gate-source voltage may be applied to the device so that the current applied to the drain flows predominantly through the channel region whereas a lesser amount of current may flow through the reverse body-diode path. In other words, it will be understood that embodiments according to the invention may still be practiced despite the fact that not all of the current flows through the conduction path that is associated with the particular condition. To the contrary, it will be understood by those of ordinary skill in the art (given the benefit of the present disclosure) that the current provided through the selected conduction path can be chosen to be a value that is sufficient to evidence the particular condition that is to be monitored.

In some embodiments according to the invention, about at least 95% of the current may flow through the selected current conduction path, whereas the remainder of the current may flow through the other current conduction path. In some embodiments according to the invention, about at least 90% of the current may flow through the selected current conduction path, whereas the remainder of the current may flow through the other current conduction path. In some embodiments according to the invention, about at least 85% of the current may flow through the selected current conduction path, whereas the remainder of the current may flow through the other current conduction path. In some embodiments according to the invention, about at least 80% of the current may flow through the selected current conduction path, whereas the remainder of the current may flow through the other current conduction path. In some embodiments according to the invention, about at least 75% of the current may flow through the selected current conduction path, whereas the remainder of the current may flow through the other current conduction path. In some embodiments according to the invention, about at least 70% of the current may flow through the selected current conduction path, whereas the remainder of the current may flow through the other current conduction path.

It will be understood that in some embodiments according to the invention, the current that is applied to the SiC MOSFET for conduction through the reverse body-diode may be greater in magnitude than the current that is applied for conduction through the channel region. It will be understood, however, that the magnitudes for the currents provided to the particular conduction paths herein demonstrate the operations of the illustrated embodiments according to the invention, however, the invention is not limited to the current values literally described herein. To the contrary, it will be understood that the current values used with embodiments according to the invention can be selected so that the particular condition being monitored can be sufficiently distinguishable from other conditions that exist within the device. For example, the current selected for use in monitoring the increase in contact resistance of a SiC MOSFET may be any value that allows the development of a resulting source-drain voltage that is sufficient to distinguish an increase in contact resistance from signal noise that may be present in the device during measurements.

Still further as appreciated by the present inventors, the SiC MOSFET being monitored for the conditions may be electrically decoupled from an application circuit in order to conduct the currents through the respective conduction paths. Accordingly, the terminals of the SiC MOSFET may be switched to a test circuit that is configured to carry out the operations described herein including measuring and recording the resulting source-drain voltages that can be used to monitor the device conditions as a function of aging. Once the test is completed, however, the terminals of the SiC MOSFET can be switched back to the application circuit.

In still other embodiments according to the present invention, however, the SiC MOSFET being monitored for the conditions may remain electrically coupled to the application circuit while conducting the currents through the respective conduction paths. In particular, in such embodiments, the operational parameters of the SiC MOSFET, such as the gate-source voltage, may be monitored while the SiC MOSFET operates in the application circuit. When the particular gate-source junction voltage that causes current conduction through one of the paths associated with the conditions being monitored is detected, the source-drain voltage developed by the SiC MOSFET may be measured and recorded so that the condition monitoring may occur in-situ. For example, if the gate-source junction voltage that causes current conduction predominantly through the reverse body-diode path is detected, the resulting source-drain voltage may be measured as an indication of the contact resistance of the device as a function of aging. In all of the approaches described herein, it will be understood that a sufficient time interval may be allowed between measurements to reduce the effect of junction temperature.

FIG. 1 is a schematic representation of a SiC MOSFET device including doped semiconductor regions therein showing a reverse body-diode conduction path and a channel region conduction path through which respective applied currents can flow in response to voltages applied across the gate-source junction of the SiC MOSFET in some embodiments according to the invention. According to FIG. 1, applied current can flow through the SiC MOSFET via either the reverse body-diode conduction path (sometimes referred to as the PiN path) or via the channel region conduction path (sometimes referred to as the MOSFET path) when the device operates in what is referred to as the third quadrant of operation (3Q) shown in FIG. 4 in some embodiments according to the invention.

Figure 4:
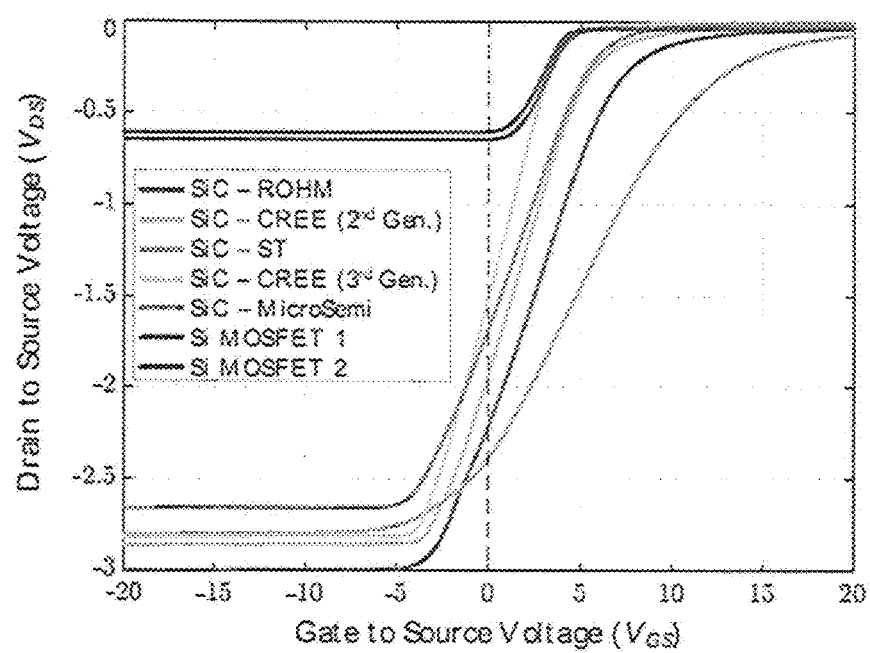
FIG. 4 is a graph illustrating various Si and SiC MOSFET reverse body-diode I-V transfer functions.

In particular, the device can carry current predominantly via the reverse body-diode conduction path (In) when the voltage applied across the gate-source junction is about −5V (the first voltage). Alternatively, the device can carry current predominantly via the channel region conduction path (Ie) when the voltage applied across the gate-source junction is in a range between about −4V to 0V (the second voltage). According to FIG. 4, a first constant current (Id) can be applied between the source and drain terminals of the device when the first voltage is applied and a second and a second constant current (Id) can be applied between the source and drain terminals of the device when the second voltage is applied. Accordingly, the first constant current (flowing predominantly via the reverse body-diode conduction path) may be greater than the second constant current (flowing predominantly via the channel region conduction path). The source-drain voltage can be measured in each when the device 1 operates in each of the conduction modes in 3Q as shown in FIG. 4. The resulting source-drain voltage can be recorded and used to monitor the condition of the contact resistance and the gate threshold of the device as it ages.

Figure 2:
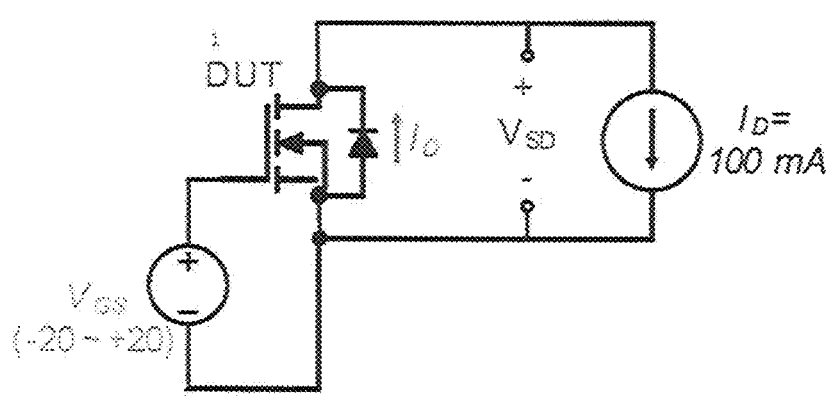
FIG. 2 is a circuit schematic diagram illustrating a test circuit including a variable voltage source electrically coupled across the gate-source junction and a variable current source electrically coupled between the source and drain terminals of the SiC MOSFET of FIG. 1 being monitored in some embodiments according to the invention.

FIG. 2 is a circuit schematic diagram illustrating a test circuit 2 including a variable voltage source Vgs electrically coupled across the gate-source junction of the device 1 and a variable current source Id electrically coupled between the source and drain terminals of the SiC MOSFET 1 of FIG. 1 with Vsd being monitored in some embodiments according to the invention. It will be understood that the test circuit 2 of FIG. 2 can be utilized to operate the device 1 (DUT) as illustrated in FIG. 4. In operation, the first current Id can be applied to the device 1 while the first voltage is applied across the gate-source junction to operate the device in 3Q which generates the first source-drain voltage Vds. Further, the second current Id can be applied to the device 1 while the second voltage is applied across the gate-source junction to operate the device in 3Q which generates the second source-drain voltage Vds.

Referring to FIG. 4, the test circuit 2 was used to obtain the reverse body-diode transfer characteristics of Si and SiC MOSFETs devices from different manufacturers as shown. According to FIG. 4, the SiC devices have greater diode voltage drop compared to the Si devices which is a result of the higher bandgap of SiC. Although as further shown in FIG. 4, Vsd remains relatively constant for Si MOSFETs at all negative gate bias values, whereas Vds varies substantially with the gate voltage of 0V to −4V for all SiC MOSFETs.

As appreciated by the present inventors, the characteristics of the SiC MOSFETs shown in FIG. 4 can be utilized for independently monitoring the package related degradation (contact resistance and the gate interface degradation (the gate threshold voltage). When the device is carries current predominantly through the channel region conduction path, the value of Vsd is dependent on channel condition. As the gate interface degrades, the channel resistance and therefore the Vsd will increase. On the other hand, when current is conducted predominantly through the reverse body-diode conduction path (the PiN diode path), the channel may not substantially conduct current and therefore the contact resistance variation will predominantly change the Vsd. For that reason, if the Vsd values can be measured at the different voltage levels applied across the gate-source junction (enabling either the PiN path or the channel region path) the condition of the SiC MOSFETs may be monitored using only the single precursor: Vsd.

In carrying out the evaluation of test devices (DUTs) for aging, the Vsd values were captured at 0V gate voltage bias throughout the aging and at −5V gate voltage bias. As it can be seen FIG. 4, 0V gate voltage bias predominantly enables the channel region conduction whereas the 5V gate voltage bias enables the reverse body-diode conduction path (PiN path) for the DUT.

Figure 3:
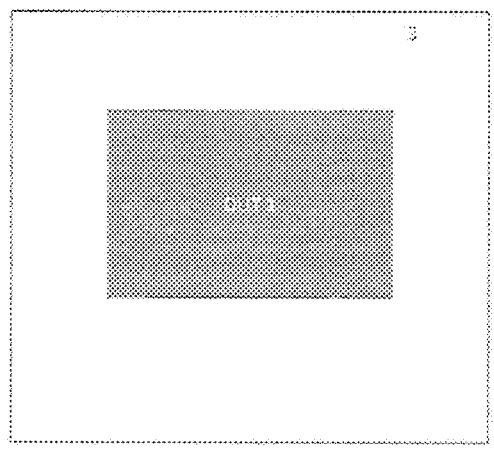
FIG. 3 is a circuit schematic diagram illustrating the SiC MOSFET of FIG. 1 embedded in an application circuit and being monitored in-situ in some embodiments according to the invention.

FIG. 3 is a circuit schematic diagram illustrating the SiC MOSFET 1 of FIG. 1 embedded in an application circuit 3 and being monitored in-situ in some embodiments according to the invention. According to FIG. 3, the SiC MOSFET 1 is embedded in an application circuit 3, such as in a motor driver circuit, and may be being monitored using embodiments according to the invention while the SiC MOSFET 1 remains electrically coupled to the application circuit 3. In such embodiments, the gate-source voltage may be monitored while the SiC MOSFET 1 operates in the application circuit 3. When the particular gate-source junction voltage that causes current conduction through one of the paths associated with the conditions being monitored is detected, the source-drain voltage developed by the SiC MOSFET 1 may be measured and recorded so that the condition monitoring may occur in-situ. For example, if the gate-source junction voltage that causes current conduction predominantly through the reverse body-diode path is detected, the resulting source-drain voltage may be measured as an indication of the contact resistance of the device as a function of aging.

Figure 5:
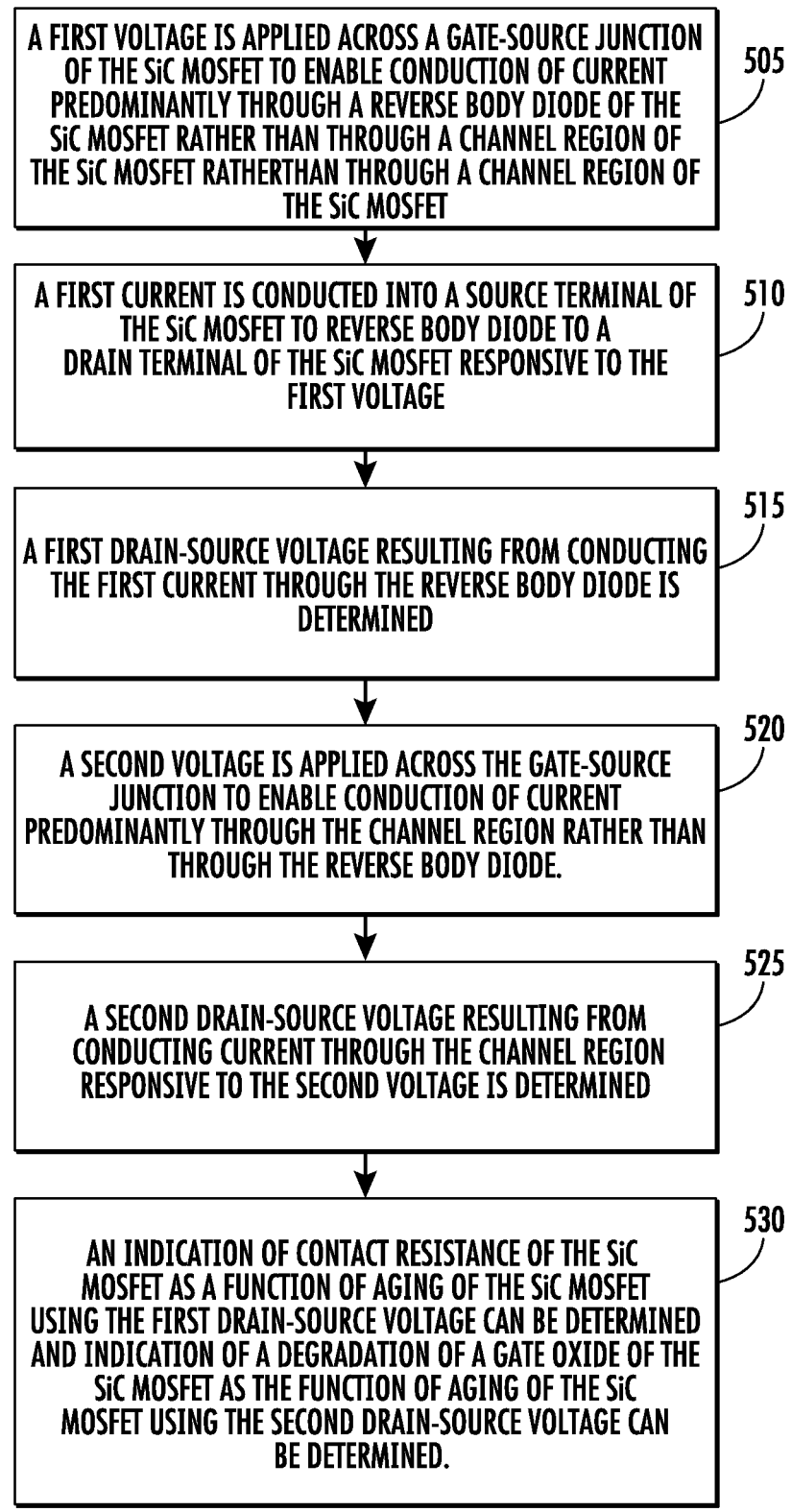
FIG. 5 is a flowchart illustrating methods of operating a SiC MOSFET to provide current conduction through a reverse body-diode path and/or a channel region in response to first and second gate-source junction voltages applied to the SiC MOSFET in some embodiments according to the invention.

FIG. 5 is a flowchart 500 illustrating methods of operating a SiC MOSFET to provide current conduction through a reverse body-diode path and/or a channel region in response to first and second gate-source junction voltages applied to the SiC MOSFET in some embodiments according to the invention MOSFET in some embodiments according to the invention. According to FIG. 5, a method of operating a SiC MOSFET can be provided by applying a first voltage across a gate-source junction of the SiC MOSFET to enable conduction of current predominantly through a reverse body diode of the SiC MOSFET rather than through a channel region of the SiC MOSFET (block 505). A first current can be conducted into a source terminal of the SiC MOSFET through the reverse body diode to a drain terminal of the SiC MOSFET responsive to the first voltage (block 510). A first drain-source voltage resulting from conducting the first current through the reverse body diode can be determined (block 515). A second voltage can be applied across the gate-source junction to enable conduction of current predominantly through the channel region rather than through the reverse body diode (block 520). A second drain-source voltage resulting from conducting current through the channel region responsive to the second voltage can be determined (block 525). An indication of contact resistance of the SiC MOSFET as a function of aging of the SiC MOSFET using the first drain-source voltage can be determined and an indication of a degradation of a gate oxide of the SiC MOSFET as the function of aging of the SiC MOSFET can be determined using the second drain-source voltage (block 530).

The following description details some of the issues that give rise to the degradation of SiC MOSFET devices, which may generally be referred to as the aging process. The degradation in semiconductor device can be classified into two categories: 1) package related degradation mechanisms and 2) die related degradation mechanisms.

A. Package Related Degradation Mechanisms

In power converter applications, the power semiconductor devices heat up and cool down due to varying load conditions, switching actions, electrical cycles, etc. This temperature cycling leads to thermo-mechanical stresses on the adjacent layers due to the differences in coefficient of thermal expansion (CTE) and eventually wears out the contact points. This temperature cycling related stress may cause packaging related degradation mechanisms such as the cracks in the bond wires, bond wire lift-off, and die attach solder degradation.

SiC dies generally may have higher power density than other type devices and may need increased heat dissipation and cooling to handle the pertinent current densities. This makes the SiC devices more prone to packaging related degradation than some other technologies. One of the most critical interface may the bond wire attachment and, in particular, the bond pad may be exposed to the full thermal swing presented by the power cycling. Cracks may form at the tail of the bond, which then may propagate within the wire material until the bond-wire gradually lifts off the pad.

B. Chip Related Degradation Mechanisms

Another reliability concern for SiC MOSFET devices is the gate oxide degradation due to aging. During thermal oxidation of SiC, the Carbon atoms may need to be removed from the system. Any remaining C atoms, however, may lead to traps at the SiC/SiO2 interface. Moreover, the larger bandgap property of SiC can decrease the conduction and valance band offsets between the SiC semiconductor and the gate dielectric, which may make the device more susceptible to higher Fowler-Nordheim tunneling currents. High temperature operation with a positive gate bias may further aggravate the SiC/SiO2 interface traps and which may expedite the gate oxide degradation (ie. aging effects).

Another reliability concern related to SiC MOSFET devices is the desire for thinner gate oxide layers in order to keep the gate voltage threshold at relatively low values. This may make SiC devices more sensitive to higher drain voltage gradients and high temperature pulses which can result in high gate leakage currents and make the device particularly susceptible to gate leakage failures. From the failure mode statistical distribution in SiC MOSFETs under short circuit robustness tests, the breakdown of the gate oxide may be found to be the most common failure mode.

In order to measure the reliability and specify the degradation mechanisms, accelerated power cycling tests were used to collect experimental data to evaluate embodiments according to the invention. A high temperature (above SOA) power cycling was utilized in order to trigger both package related and die related degradation mechanisms. This enabled tracking of variations in electrical parameters throughout the aging for both degradation mechanisms.

Figure 6:
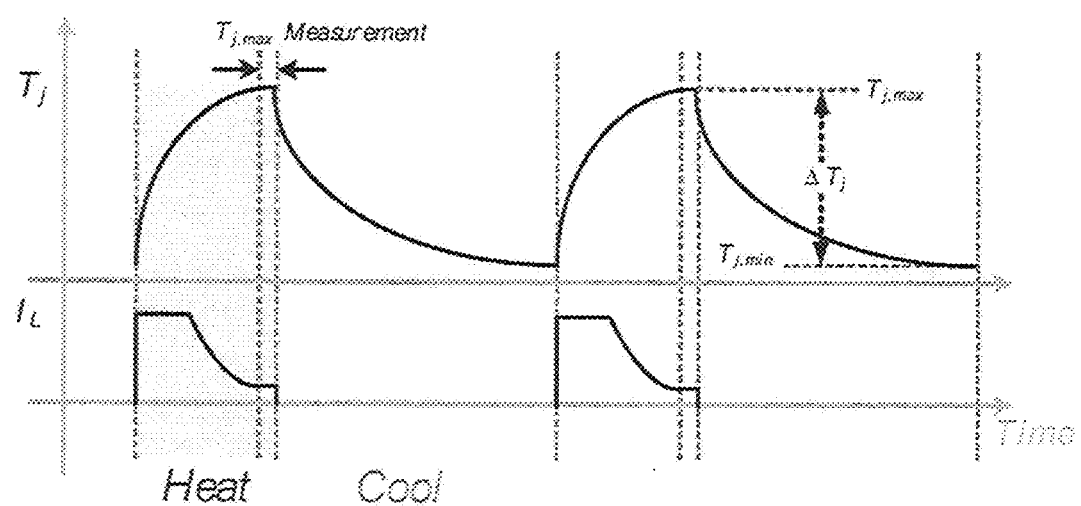
FIG. 6 is a graph illustrating SiC MOSFET devices according to the invention under test being heated to achieve a high junction temperature at a relatively small current to reduce stress in the wire bond without overstressing the wire bond.

The devices were actively heated without a heat sink to achieve a high junction temperature at relatively small current values to reduce the likelihood of overstressing the wire bond. SiC MOSFET devices were aged with a junction temperature swing from 30° C. to 200° C. The operating principle of the power cycling test used in this study is given in FIG. 6. FIG. 6 shows a graph that illustrates SiC MOSFET devices under test being heated to achieve a high junction temperature at a relatively small current to reduce stress in the wire bond without overstressing the wire bond. In order to investigate the variation of electrical parameters with the aging/degradation state of the switch, seven SiC MOSFETs were aged for 10000 cycles. After each 250 aging cycling, a systematic static parameter evaluation of each device was performed at room temperature with the aid of the Keysight B1506 A curve tracer. In the following sections, the static parameter variations are presented.

A. Variation of Threshold Voltage (Vth)

Figure 7:
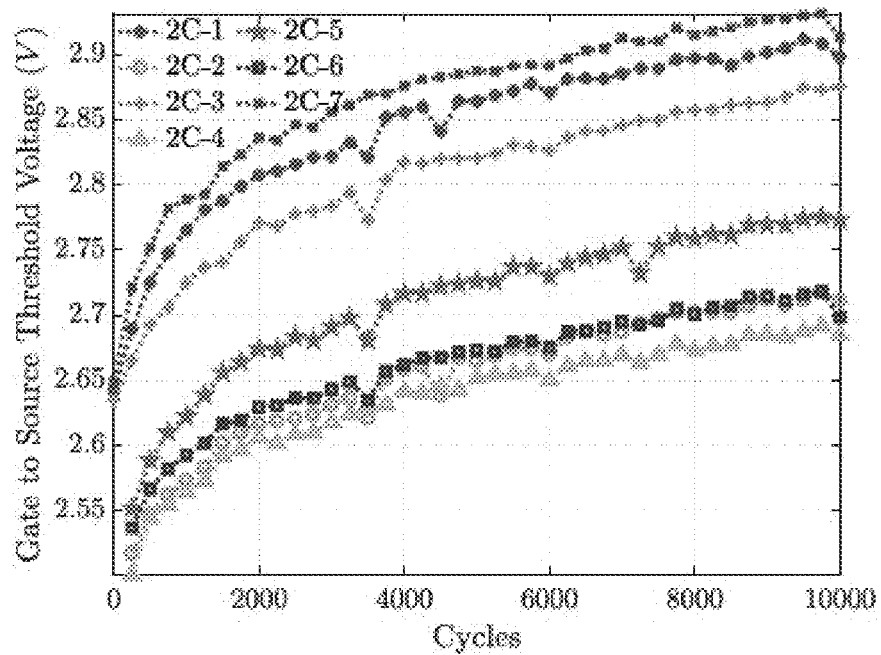
FIG. 7 is a graph showing the increase in the value of threshold voltage as a function of number of power cycles using Id=250 µA in some embodiments according to the invention.
Figure 8:
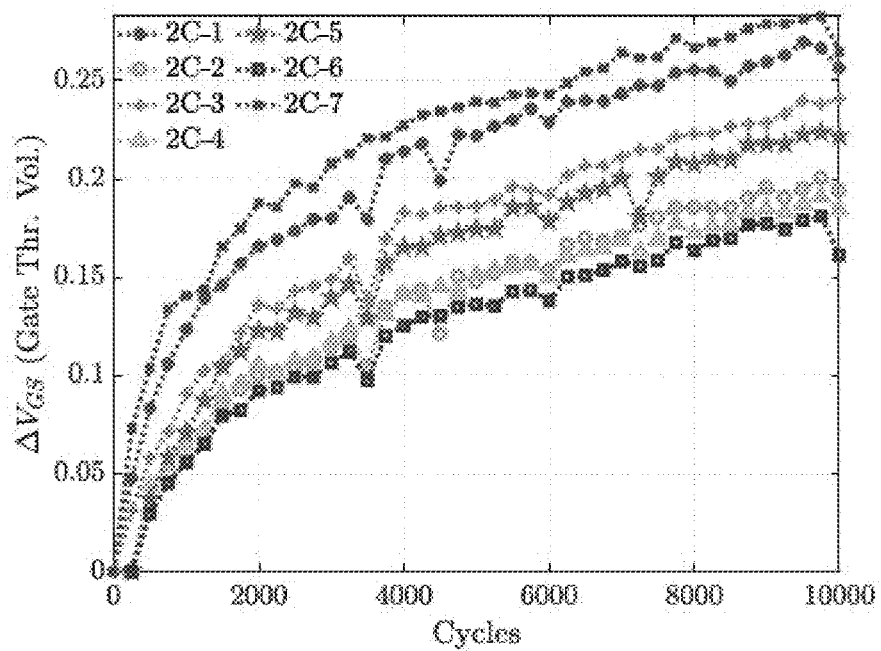
FIG. 8 is a graph showing the threshold voltage shift relative to initial value as a function of number of power cycles using Id=250 µA in some embodiments according to the invention.

Since Vth is often presented as a precursor parameter for gate oxide degradation in the literature, the Vth variation over aging is presented for all DUTs in FIGS. 7 and 8. The quantitate Vth data in FIGS. 7 and 8 show an increase of the threshold voltage by 7.1% to 10.7% at the end of the aging test. The reason for this gradual increase in threshold voltage can be due to the gate oxidation degradation related interface trapped charge ($Qi_t$). Theoretically, the threshold voltage of the SiC MOSFET can be calculated by $$V_{th} = V_{th0} - \frac{Q_{ot}}{C_{ox}} + \frac{qN_{it}}{C_{ox}} \quad (1)$$

where Qot is oxide trapped charge, q is the fundamental electronic charge. Nit is interface trap density, and Cox is oxide capacitance. As can be seen from equation (1), the existence of near interface trapped charge can increase the threshold voltage. Therefore, Vth can be utilized as an aging precursor for gate oxide degradation.

B. Variation of On-State Resistance (Rds_on)

Figure 9:
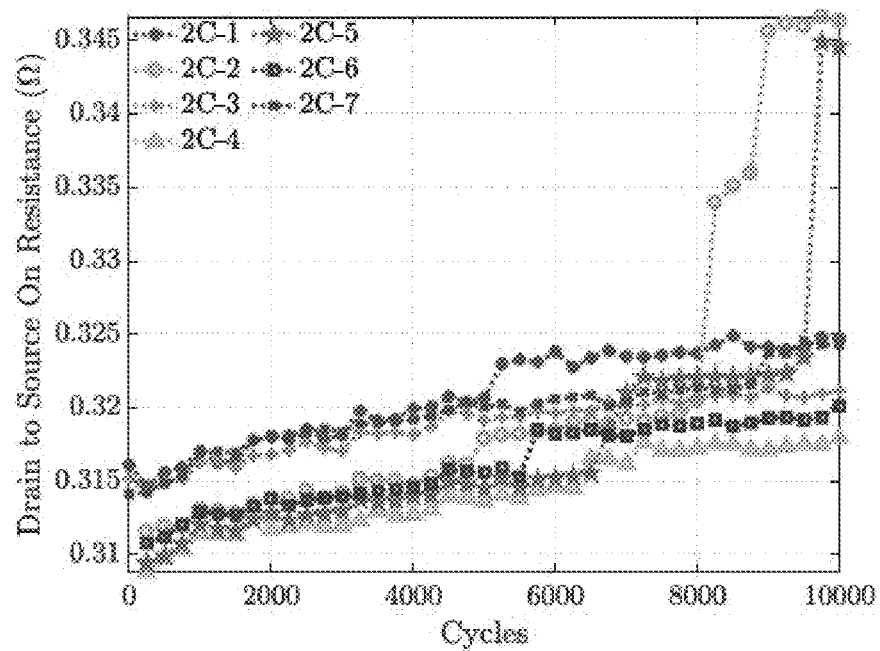
FIG. 9 is a graph showing the increase in the value of on-resistance as a function of number of power cycles using Id=4.5 A, and Vgs=20V in some embodiments according to the invention.
Figure 10:
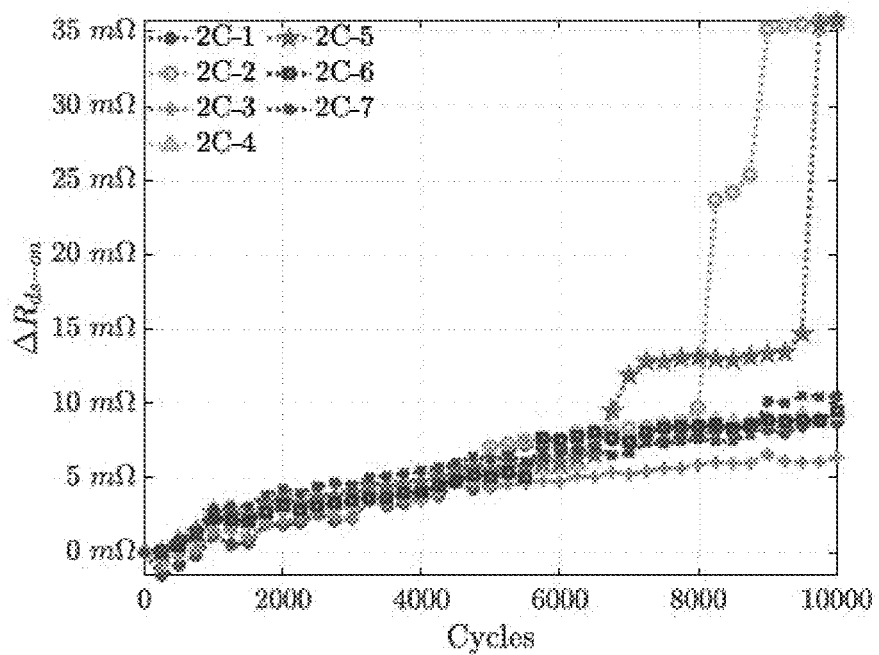
FIG. 10 is a graph showing the increase in the value of on-resistance relative to the initial value as a function of number of power cycles using Id=4.5 A, and Vgs=20V in some embodiments according to the invention.

Another parameter that may be a precursor for both Si and SiC MOSFETs is the Rds_on. The Rds_on over the aging cycles for the DUTs is presented in FIGS. 9 and 10. Specifically, FIG. 9 is a graph showing the increase in the value of on-resistance as a function of number of power cycles using Id=4.5 A, and Vgs=20V in some embodiments according to the invention and FIG. 10 is a graph showing the increase in the value of on-resistance relative to the initial value as a function of number of power cycles using Id=4.5 A, and Vgs=20V in some embodiments according to the invention. Referring to FIGS. 9 and 10, a gradual increase is observed for all the devices before the first 6000 cycles. This part of the increase shows a very similar trend to Vth variation and assumed to be related to the gate oxide degradation. Because of the low inversion carrier mobility of SiC MOSFETs the channel resistance (Rch) represents a significant portion to the Rds,on and it can be calculated as:

$$R_{ch} = \frac{L_{ch}}{W_{ch} \cdot \mu_n \cdot C_{ox}(V_{gs} - V_{th})} \quad (2)$$

where Lch is the channel length, Wch is the channel width, μn is the electron mobility of the inversion layer channel in SiC material, and Vgs is the gate drive voltage. As it can be seen from equation (2), positive Vth drift will also increase the Rch. However, in addition to Rch, the package related degradation will also affect the Rds_on. As can be seen from FIGS. 9 and 10, a sudden increase of on-state resistance is observed for devices 2C-2 and 2C-5. Mostly, the bond wire crack, bond wire lift-off or solder degradation on the drain side of the device contribute to the sudden increase in Rds_on.

C. Variation of Body Diode Voltage (VSD)

Figure 11:
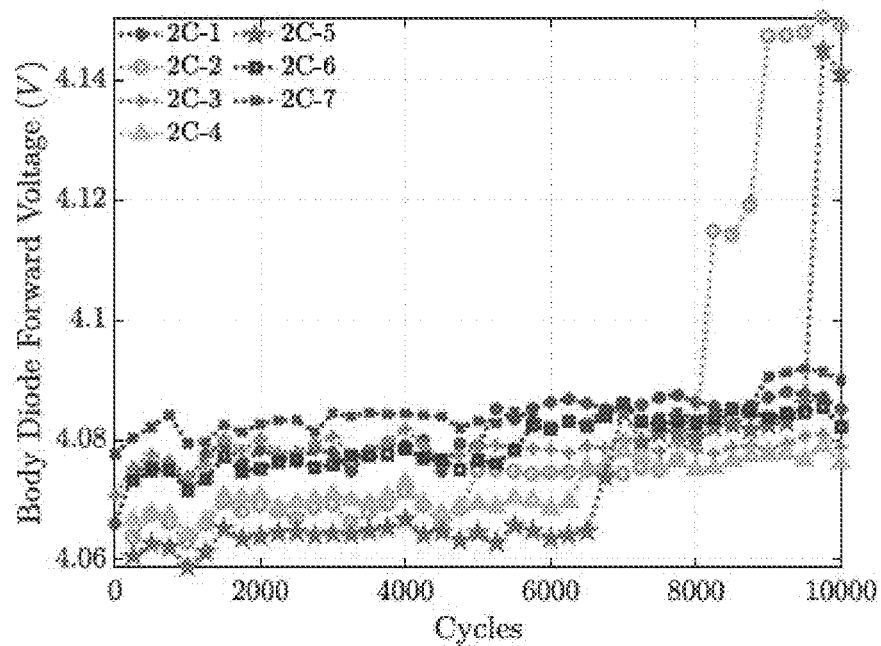
FIG. 11 is a graph showing the decrease in the value of reverse body-diode voltage drop as a function of power cycles using Id=−3 A and Vgs=−5V in some embodiments according to the invention.
Figure 12:
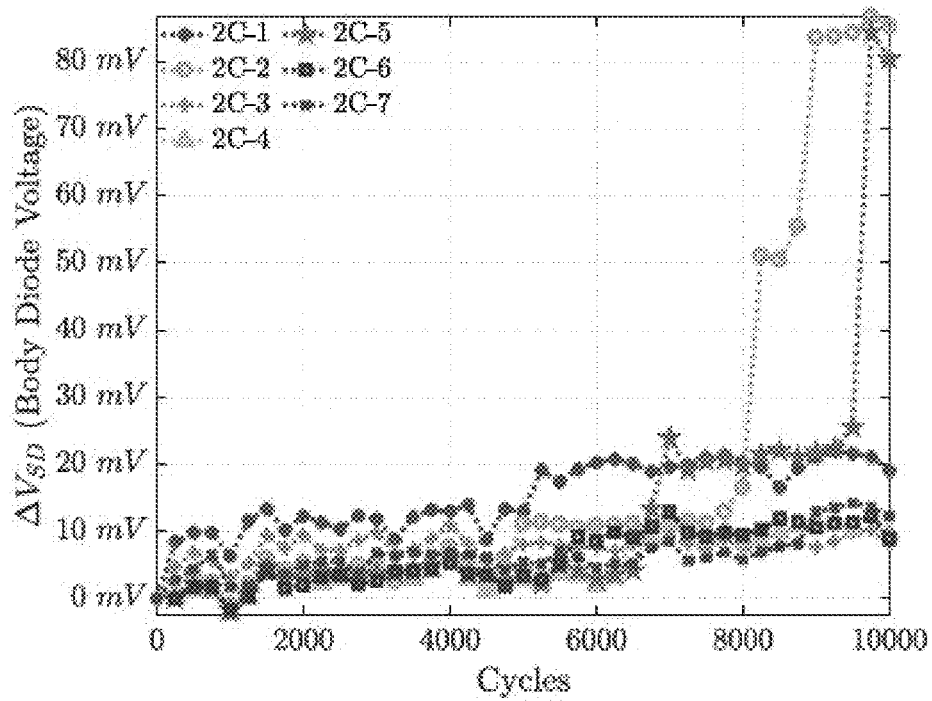
FIG. 12 is a graph showing the decrease in the value of reverse body-diode voltage drop relative to the initial value as a function of power cycles using Id=−3 A and Vgs=−5V in some embodiments according to the invention.

Another precursor parameter which may be used is Vsd. The variation of Vsd at −3 A drain current and −5V gate bias through aging is given in FIGS. 11 and 12. In particular, FIG. 11 is a graph showing the decrease in the value of reverse body-diode voltage drop as a function of power cycles using Id=−3 A and Vgs=−5V in some embodiments according to the invention and FIG. 12 is a graph showing the decrease in the value of reverse body-diode voltage drop relative to the initial value as a function of power cycles using Id=−3 A and Vgs=−5V in some embodiments according to the invention. As it can be seen from FIGS. 11 and 12, the variation in the Vsd is small over power cycles for most of the devices. However, devices 2C-2 and 2C-5 showed an increase after about 8000 cycles which is consistent with the sudden increases of the Rds_on. The results in FIGS. 11 and 12 illustrate that the sudden increase in the Rds_on is related to the degradation in packaging. In particular, at a negative voltage of −5V, the current path of the PiN diode conduction does not include the channel, and consequently the threshold voltage drift does not substantially affect the reverse body-diode voltage drop.

Figure 13:
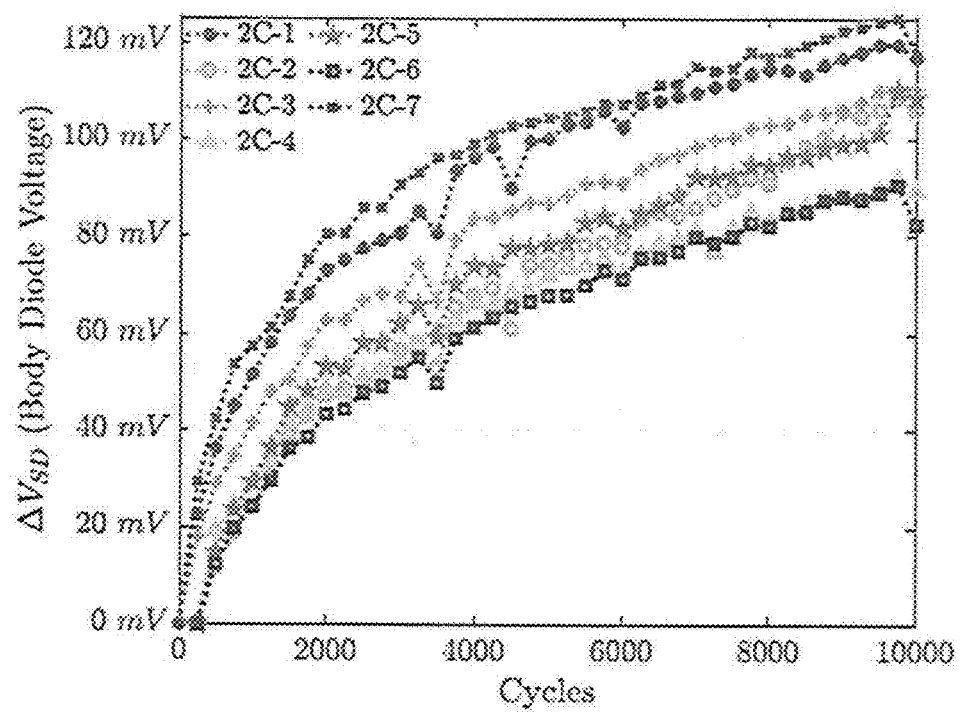
FIG. 13 is a graph illustrating reverse body-diode voltage drop increase as a function of power cycles using Id=−0.5 A and $V_{gs}$=0V in some embodiments according to the invention.

FIG. 13 is a graph illustrating reverse body-diode voltage drop increase as a function of power cycles using Id=−0.5 A and $V_{gs}$=0V in some embodiments according to the invention. According to FIG. 13, the Vsd at 0V gate bias is similar to the Vth drift shown in FIG. 8. These results support that package related degradation and the gate interface degradation may be monitored by tracking the Vsd at two different voltages applied across the gate-source junction as described herein.

It will be further understood that for some SiC MOSFETs, the complete transition from the channel region path conduction (MOSFET path) to the reverse body-diode conduction path (PiN path) may not be obtained at −5V gate bias as it can be seen from FIG. 4. Therefore, the negative gate voltage value should be defined properly for the specific device to ensure conduction predominantly via the reverse body-diode conduction path (PiN path).

In addition to the value of negative gate bias value, another parameter used for monitoring is the drain current value. In order to test the influence of detection current value on the monitoring, the Vsd measurements at both 0V and −5V gate bias were obtained at different drain currents. In FIG. 14 the Vsd variation of device 2C-2 throughout the aging at −5V gate bias is shown. As it can be seen from FIG. 14, the sensitivity of the signal increased with the drain current. This is an anticipated result and indeed this result supports that the sudden increase of Rds_on and Vsd at −5V gate bias for device 2C-2 is due to ohmic contact resistance increase. In FIG. 15, the Vsd variation over aging is given at 0V gate bias. At 0V gate bias, the sensitivity of the signal to the gate oxide degradation slightly decreased with increasing drain current. Moreover, an indication of the ohmic contact resistance increase starts to appear in the signal for drain current values at greater than 0.5 A. Therefore, although increasing the drain current amplifies the sensitivity of the Vsd variation to the packing degradation, a detection current of about 0.5 A may be used. This may reduce possible influence of the ohmic contact resistance increase on the gate oxide degradation monitoring and further establish independent monitoring of both degradation mechanisms.

Figure 18:
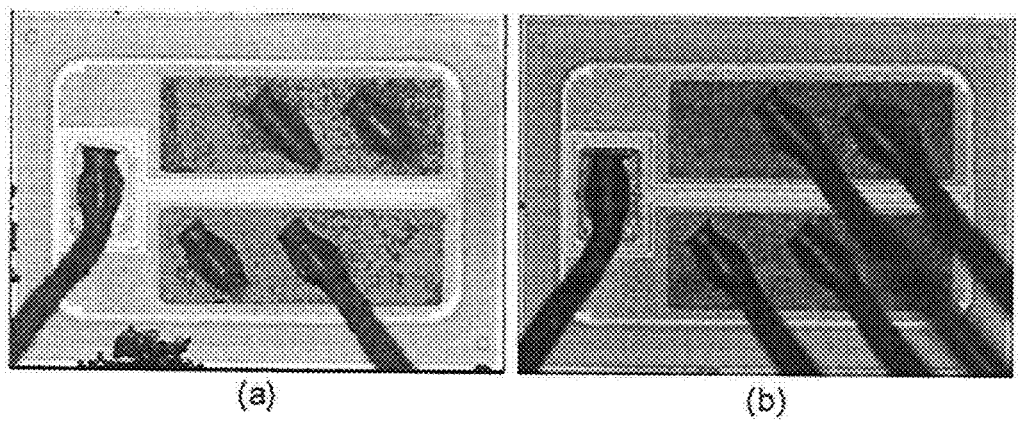
FIGS. 18A-B are photographic images of die surfaces after decapsulation for samples 2C-2 and 2C-3, respectively, in some embodiments according to the invention.

FIGS. 16-18 present failure analysis results collected on selected devices under test to evaluate the package related degradation and to help identify the cause of degradation. Specifically, FIG. 16 is a graph illustrating variation of source-drain voltage VSD vs. drain current for various temperatures using $V_{gs}=-5V$ in some embodiments according to the invention. FIG. 17A-D are C-SAM images of the switches through power cycling including a top side C-SAM image of 2C-2, a top side C-SAM image of 2C-3, a bottom side C-SAM image of 2C-2, and a bottom side C-SAM image of 2C-3, respectively, in some embodiments according to the invention. FIGS. 18A-B are photographic images of die surfaces after decapsulation for samples 2C-2 and 2C-3, respectively, in some embodiments according to the invention.

Referring to FIGS. 16-18, two devices, one assumed to have packaging related degradation (2C-2) and the other one assumed to have no packaging related degradation (2C-3) were chosen for failure analysis. The devices were first inspected with non-destructive analysis methods using the C-Mode Scanning Acoustic Microscopy (C-SAM) and the THRU-Scan Acoustic Microscopy (T-SAM) in order to detect internal defects. The C-SAM images of both devices are presented in FIG. 10. The images were generated by focusing the ultrasound through the top (encapsulated) and back (head sink) sides of the components. A combined image of the mold compound to heat sink and mold compound to leads interface form topside for switches 2C-2 and 2C-3 are shown in FIG. 17a-b, respectively. The leads are at a different height within the parts relative to the die/heat sink level, accordingly the images were generated in two scans at two different focus levels, but are displayed in a single image. The areas with good adhesion are not highlighted whereas the areas showing delamination are designated as 1701 and 1702. As it can be seen from the figures, both devices show some anomalies around die surface Additionally, FIG. 17-a-d show delamination at the mold compound to heat sink interface for device 2C-3 as indicated 1702. The backside images for switches 2C-2 and 2C-3 are given in FIGS. 17c-d respectively, where the focus is adjusted to the heat sink to the die attach level. In these pictures, the areas of good adhesion are not referenced whereas the areas referenced as 1703 indicates voiding. Bottom side images show that die attachments of both devices are well bonded.

Following the non-destructive analysis, the devices were inspected through the destructive analysis to find other physical failure mechanisms. Both devices were decapsulated for optical inspection using a combination of laser ablation and sulfuric acid at 120° C. The optical inspection was carried out after the decapsulation of the mold compound as shown in FIG. 18 a-b. The inspection revealed that three bond wires were detached for device 2C-2 (FIG. 18a) whereas all four bond wires were attached for 2C-3 (FIG. 18b). Given that the same decapsulation process was applied to both devices, the appearance of the crack in device 2C-2 indicates that the crack was not caused by decapsulation process but due to the thermal-mechanical stress during the aging process.

Because embodiments according to the invention may be implemented using software instructions, the components and operation of a generic programmable computer system on which various embodiments of the disclosed technology may be employed will first be described. The components and operation of a computer network having a host or master computer and one or more remote or servant computers therefore will be described with reference to FIG. 19. This operating environment is only one example of a suitable operating environment, however, and is not intended to suggest any limitation as to the scope of use or functionality of the disclosed technology.

Figure 19:
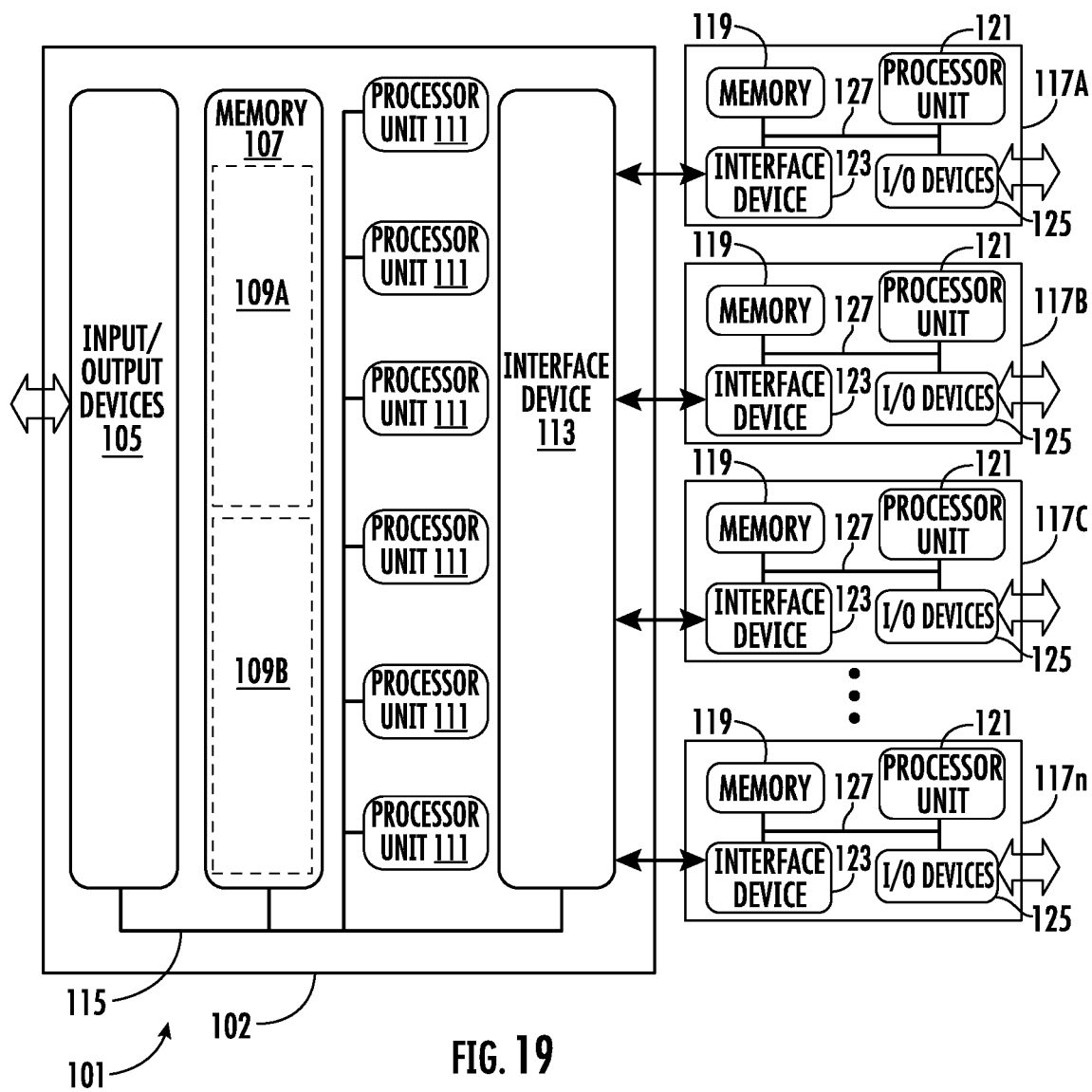
FIG. 19 illustrates an example of a computing system that may be used to implement embodiments according to the invention.

In FIG. 19, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor circuits 111 and an interface device 113. The processor circuits 111 may be any type of processor device that can be programmed to execute the software instructions 109A, but will conventionally be a microprocessor device. For example, one or more of the processor circuits 111 may be a commercially generic programmable microprocessor, such as Intel. Pentium. or Xeon microprocessors, Advanced Micro Devices Athlon™ microprocessors or Motorola 68K/Coldfire. microprocessors. Alternately or additionally, one or more of the processor circuits 111 may be a custom-manufactured processor, such as a microprocessor designed to optimally perform specific types of mathematical operations. The interface device 113, the processor circuits 111, the memory 107 and the input/output devices 105 are connected together by a bus 115.

Figure 20:
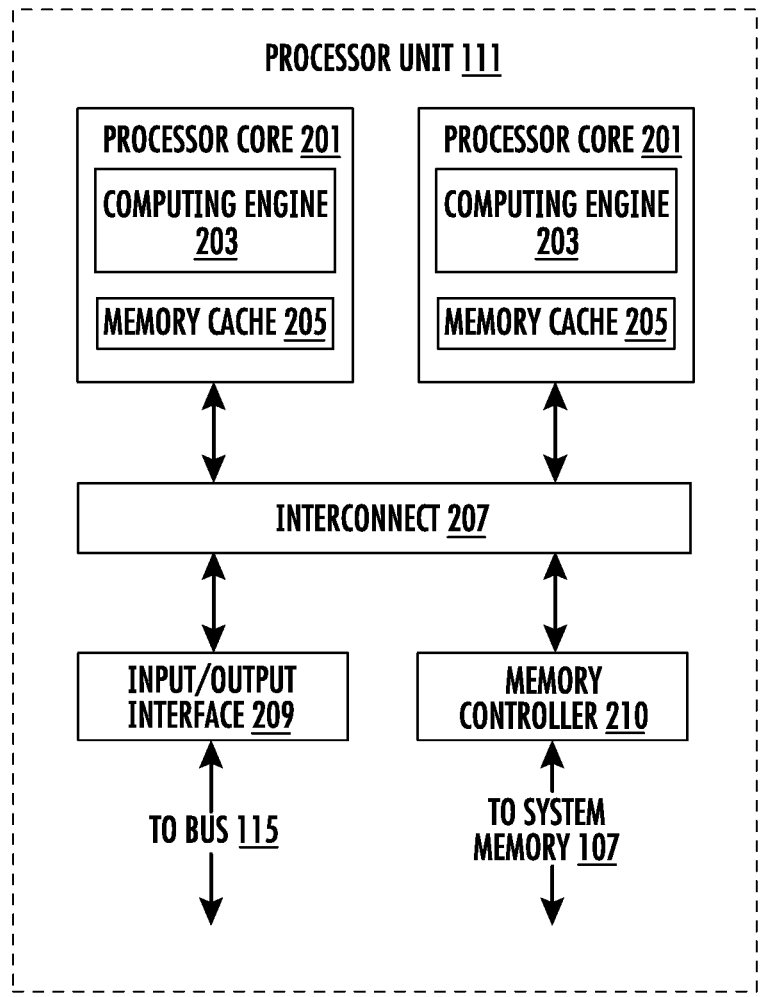
FIG. 20 illustrates an example of a processor circuit that may be used to implement embodiments according to the invention.

With some implementations of the disclosed technology, the master computing device 103 may employ one or more processing units 111 having more than one processor core. Accordingly, FIG. 20 illustrates an example of a multi-core processor circuit 111 that may be employed with various embodiments of the disclosed technology. As seen in this figure, the processor circuit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor circuit 111. With some processor cores 201, such as the Cell microprocessor created by Sony Corporation, Toshiba Corporation and IBM Corporation, the interconnect 207 may be implemented as an interconnect bus. With other processor circuits 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor circuit 111 and the bus 115. Similarly, the memory controller 210 controls the exchange of information between the processor circuit 111 and the system memory 107. With some implementations of the disclosed technology, the processor circuits 111 may include additional components, such as a high-level cache memory accessible shared by the processor cores 201.

While FIG. 20 shows one illustration of a processor circuit 111 that may be employed by some embodiments of the disclosed technology, it should be appreciated that this illustration is representative only, and is not intended to be limiting. Also, with some implementations, a multi-core processor circuit 111 can be used in lieu of multiple, separate processor circuits 111. For example, rather than employing six separate processor circuits 111, an alternate implementation of the disclosed technology may employ a single processor circuit 111 having six cores, two multi-core processor circuits each having three cores, a multi-core processor circuit 111 with four cores together with two separate single-core processor circuits 111, etc.

Returning now to FIG. 19, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor circuit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor circuits 121 may be any type of conventional or custom-manufactured programmable processor device. For example, one or more of the processor circuits 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor circuits 121 may be custom-manufactured processors, such as microprocessors designed to optimally perform specific types of mathematical operations. Still further, one or more of the processor circuits 121 may have more than one core, as described with reference to FIG. 2 above. For example, with some implementations of the disclosed technology, one or more of the processor circuits 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor circuit computer with multiple processor circuits 111, while each servant computer 117 has a single processor circuit 121. It should be noted, however, that alternate implementations of the disclosed technology may employ a master computer having single processor circuit 111. Further, one or more of the servant computers 117 may have multiple processor circuits 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 19 and FIG. 20 is provided as an example only, and it not intended to suggest any limitation as to the scope of use or functionality of alternate embodiments of the disclosed technology.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

In the drawings, the shapes and dimensions of elements may be exaggerated for clarity, and the same reference numerals will be used throughout to designate the same or like elements. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated elements but do not preclude the presence or addition of one or more other elements.

While exemplary embodiments have been shown and described above, it will be apparent to those skilled in the art that modifications and variations could be made without departing from the spirit and scope of the present disclosure as defined by the appended claims.

What is claimed is:

1. A method of operating a SiC MOSFET, the method comprising:
    applying a first voltage across a gate-source junction of the SiC MOSFET to enable conduction of current predominantly through a reverse body diode of the SiC MOSFET rather than through a channel region of the SiC MOSFET;
    conducting a first current into a source terminal of the SiC MOSFET through the reverse body diode to a drain terminal of the SiC MOSFET responsive to the first voltage;
    determining a first drain-source voltage resulting from conducting the first current through the reverse body diode;
    applying a second voltage across the gate-source junction to enable conduction of current predominantly through the channel region rather than through the reverse body diode;
    determining a second drain-source voltage resulting from conducting current through the channel region responsive to the second voltage;
    determining an indication of contact resistance of the SiC MOSFET as a function of aging of the SiC MOSFET using the first drain-source voltage; and
    determining an indication of a degradation of a gate oxide of the SiC MOSFET as the function of aging of the SiC MOSFET using the second drain-source voltage.

2. The method according to claim 1 wherein applying the first voltage across the gate-source junction disables conduction of current through the channel region of the SiC MOSFET.

3. The method according to claim 2 wherein applying the second voltage across the gate-source junction disables conduction of the current through the reverse body diode of the SiC MOSFET.

4. The method according to claim 1 further comprising:
    conducting a second current into the source terminal of the SiC MOSFET through the channel region to a drain terminal after determining the first drain-source voltage, wherein the first current is greater than the second current.

5. The method according to claim 1 further comprising:
    electrically decoupling the source terminal, a gate terminal and a drain terminal from an application circuit in which the SiC MOSFET is included before applying the first voltage across the gate-source junction of the SiC MOSFET; and
    electrically coupling the source terminal, the gate terminal and the drain terminal to the application circuit after determining the second drain-source voltage.

6. The method according to claim 5 further comprising:
    allowing sufficient time for junction temperatures in the SiC MOSFET to reach a repeatable level before applying the first voltage and the second voltage across the gate-source junction.

7. The method according to claim 3 wherein the source terminal, a gate terminal and a drain terminal remain electrically coupled to an application circuit in which the SiC MOSFET is included while determining the first drain-source voltage and the second drain-source voltage.

8. The method according to claim 7 wherein determining the first drain-source voltage is performed responsive to detecting that the conduction of the current through the channel region is disabled and/or detecting that the conduction of the current through the reverse body diode is enabled; and wherein determining the second drain-source voltage is performed responsive to detecting that the conduction of the current through the channel region is enabled and/or detecting that the conduction of the current through the reverse body diode is disabled.

9. The method according to claim 1 wherein operations of applying the first voltage, conducting the first current, determining the first drain-source voltage, applying the second voltage, and determining the second drain-source voltage are repeated periodically to provide the indication of the degradation of the gate oxide of the SiC MOSFET as the function of aging of the SiC MOSFET and the indication of the contact resistance of the SiC MOSFET as the function of aging of the SiC MOSFET.

10. The method of claim 1 wherein the first current conducted through the reverse body diode is at least about 95% of the current applied to the source terminal of the SiC MOSFET and a remainder of the current applied to the source terminal of the SiC MOSFET is conducted through the channel region of the SiC MOSFET.

11. The method of claim 1 wherein a magnitude of the first current is selected to be sufficient to detect an increase in a contact resistance variation of the SiC MOSFET as a function of aging of the SiC MOSFET.

12. The method of claim 4 wherein a magnitude of the second current is selected to be sufficient to detect an increase in a gate threshold voltage variation without a substantial effect due to a contact resistance of the SiC MOSFET as a function of aging of the SiC MOSFET.

13. The method according to claim 1 further comprising:
electrically decoupling the source terminal, a gate terminal and a drain terminal from an application circuit in which the SiC MOSFET is included before applying the first voltage across the gate-source junction of the SiC MOSFET; and
electrically coupling the source terminal, the gate terminal and the drain terminal to the application circuit after determining the second drain-source voltage.

14. A SiC MOSFET test circuit comprising:
a variable voltage circuit selectively coupled across a gate-source junction of a SiC MOSFET, the variable voltage circuit configured to provide a first voltage to disable conduction of current through a channel region of the SiC MOSFET and to enable conduction of current through a reverse body diode of the SiC MOSFET and configured to provide a second voltage across the gate-source junction to enable conduction of current through the channel region rather than through the reverse body diode;
a current circuit selectively coupled between a drain terminal of the SiC MOSFET and a source terminal of the SiC MOSFET, the current circuit configured to provide a first current into the source terminal through the reverse body diode to the drain terminal; and
a drain-source voltage detector circuit electrically coupled across the drain terminal and the source terminal, the drain-source voltage detector circuit configured to detect a first drain-source voltage generated responsive to the first voltage and configured to detect a second drain-source voltage generated responsive to the second voltage,
wherein operations of the test circuit are repeated periodically to provide an indication of a degradation of a gate oxide of the SiC MOSFET as a function of aging and an indication of contact resistance of the SiC MOSFET as the function of aging based on the first drain-source voltage and second drain-source voltage.

15. The circuit of claim 14 wherein the current circuit is configured to provide a second current into the source terminal through the channel region to the drain terminal after determining the first drain-source voltage, wherein the first current is greater than the second current.

16. The circuit of claim 15 further comprising:
an application circuit selectively coupled to a gate terminal, the drain terminal, and the source terminal, wherein the application circuit is configured to operate using the SiC MOSFET in an operating mode; and
a switch configured to electrically decouple the source terminal, the gate terminal and the drain terminal from the application circuit in which the SiC MOSFET is included before applying the first voltage across the gate-source junction of the SiC MOSFET in a test mode and is configured to electrically couple the source terminal, the gate terminal and the drain terminal to the application circuit after determining the second drain-source voltage.

17. The circuit of claim 16 wherein the switch is configured to decouple the SiC MOSFET from the application circuit for a time that is sufficient for junction temperatures in the SiC MOSFET to reach a repeatable level before applying the first voltage and the second voltage across the gate-source junction.

18. A method of operating a SiC MOSFET, the method comprising:
applying an input signal to terminals of a SiC MOSFET to disable conduction of current through a channel region of the SiC MOSFET and to enable conduction of current through a reverse body diode of the SiC MOSFET to operate the SiC MOSFET in conduction modes of a third quadrant of I-V characteristics of the SiC MOSFET;
applying a second signal to the terminals of a SiC MOSFET to enable conduction of current through the channel region rather than through the reverse body diode to operate the SiC MOSFET in the conduction modes of the third quadrant of I-V characteristics of the SiC MOSFET; and
determining both an indication of a degradation of a gate oxide of the SiC MOSFET and an indication of contact resistance of the SiC MOSFET while the SiC MOSFET operates in the conduction modes of the third quadrant of the I-V characteristics of the SiC MOSFET using the first and second input signals.

19. The method of claim 18 wherein determining both the indication of the degradation of the gate oxide of the SiC MOSFET and the indication of the contact resistance of the SiC MOSFET using the first and second input signals comprises: measuring first and second voltage drops across a reverse body diode included in the SiC MOSFET responsive to the first and second input signals to provide the indication of the degradation of the gate oxide of the SiC MOSFET and the indication of the contact resistance of the SiC MOSFET, respectively.

* * * * *

UNITED STATES PATENT AND TRADEMARK OFFICE
CERTIFICATE OF CORRECTION

PATENT NO. : 11,474,145 B2
APPLICATION NO. : 16/897719
DATED : October 18, 2022
INVENTOR(S) : Ugur et al.

Page 1 of 2

It is certified that error appears in the above-identified patent and that said Letters Patent is hereby corrected as shown below:

In the Drawings

FIG. 5: Please correct by deleting the duplicate language "RATHER THAN THROUGH A CHANNEL REGION OF THE SiC MOSFET" found in the last two lines of Block 505

"
A FIRST VOLTAGE IS APPLIED ACROSS A GATE-SOURCE JUNCTION OF THE SiC MOSFET TO ENABLE CONDUCTION OF CURRENT PREDOMINANTLY THROUGH A REVERSE BODY DIODE OF THE SiC MOSFET RATHER THAN THROUGH A CHANNEL REGION OF THE SiC MOSFET RATHERTHAN THROUGH A CHANNEL REGION OF THE SiC MOSFET
" and inserting A FIRST VOLTAGE IS APPLIED ACROSS A GATE-SOURCE JUNCTION OF THE SiC MOSFET TO ENABLE CONDUCTION OF CURRENT PREDOMINANTLY THROUGH A REVERSE BODY DIODE OF THE SiC MOSFET RATHER THAN THROUGH A CHANNEL REGION OF THE SiC MOSFET

--

Signed and Sealed this
Nineteenth Day of September, 2023

*Katherine Kelly Vidal*
Katherine Kelly Vidal
*Director of the United States Patent and Trademark Office*

CERTIFICATE OF CORRECTION (continued)
U.S. Pat. No. 11,474,145 B2

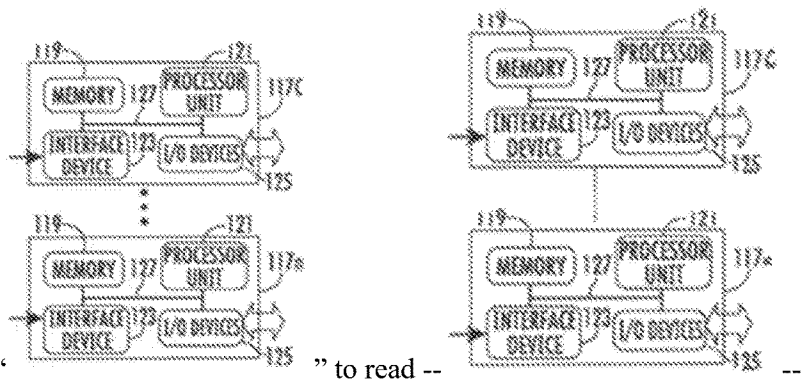

FIG. 19: Please correct " " to read -- --

In the Specification

Column 1, Line 39: Please correct "(Vth)" to read -- ($V_{th}$) --

Column 1, Line 46: Please correct "Rds,on" to read -- $R_{ds,on}$ --

Column 3, Line 45: Please correct "VSD vs" to read -- $V_{SD}$ vs --

Column 9, Line 24: Please correct "Vth" to read -- $V_{th}$ --

Column 11, Line 12: Please correct "VSD vs" to read -- $V_{SD}$ vs --